(12) United States Patent
Yaniv et al.

(10) Patent No.: US 8,647,979 B2
(45) Date of Patent: Feb. 11, 2014

(54) BUFFER LAYER TO ENHANCE PHOTO AND/OR LASER SINTERING

(75) Inventors: Zvi Yaniv, Austin, TX (US); Mohshi Yang, Austin, TX (US); Peter B. Laxton, Austin, TX (US)

(73) Assignees: Applied Nanotech Holdings, Inc., Austin, TX (US); Ishihara Chemical Co., Ltd., Hyogo-Ku, Hyogo (JP)

( * ) Notice: Subject to any disclaimer, the term of this patent is extended or adjusted under 35 U.S.C. 154(b) by 115 days.

(21) Appl. No.: 13/260,893

(22) PCT Filed: Mar. 26, 2010

(86) PCT No.: PCT/US2010/028811
§ 371 (c)(1),
(2), (4) Date: Sep. 28, 2011

(87) PCT Pub. No.: WO2010/111581
PCT Pub. Date: Sep. 30, 2010

(65) Prior Publication Data
US 2012/0049384 A1 Mar. 1, 2012

Related U.S. Application Data

(60) Provisional application No. 61/163,894, filed on Mar. 27, 2009, provisional application No. 61/174,758, filed on May 1, 2009.

(51) Int. Cl.
*H01L 23/48* (2006.01)
(52) U.S. Cl.
USPC .... 438/637; 438/151; 257/774; 257/E23.011; 257/E21.577
(58) Field of Classification Search
USPC ............. 257/774, E27.113–E27.116, 23.018; 438/637, 151
See application file for complete search history.

(56) References Cited

U.S. PATENT DOCUMENTS 3,239,597 A   3/1966   Flynn
3,580,731 A   5/1971   Milewski wt al.
(Continued)

FOREIGN PATENT DOCUMENTS

CN   1509206 A   6/2004
JP   62124084    6/1987
(Continued)

OTHER PUBLICATIONS

The State Intellectual Property Office of the People's Republic of China, Notice on Grant of Patent Right for Invention, Application No. 200880021733.6, Apr. 20, 2012.

(Continued)

*Primary Examiner* — Marc Armand
(74) *Attorney, Agent, or Firm* — Kelly Kordzik; Matheson Keys & Kordzik PLLC (57) ABSTRACT

Conductive lines are deposited on a substrate to produce traces for conducting electricity between electronic components. A patterned metal layer is formed on the substrate, and then a layer of material having a low thermal conductivity is coated over the patterned metal layer and the substrate. Vias are formed through the layer of material having the low thermal conductivity thereby exposing portions of the patterned metal layer. A film of conductive ink is then coated over the layer of material having the low thermal conductivity and into the vias to thereby coat the portions of the patterned metal layer, and then sintered. The film of conductive ink coated over the portion of the patterned metal layer does not absorb as much energy from the sintering as the film of conductive ink coated over the layer of material having the low thermal conductivity. The layer of material having the low thermal conductivity may be a polymer, such as polyimide.

25 Claims, 10 Drawing Sheets

(56) References Cited

U.S. PATENT DOCUMENTS

| | | |
|---|---|---|
| 3,796,598 A | 3/1974 | Gejyo et al. |
| 3,950,605 A | 4/1976 | Hori et al. |
| 4,093,466 A | 6/1978 | Davis |
| 4,194,913 A | 3/1980 | Davis |
| RE30,434 E | 11/1980 | Davis |
| 4,234,631 A | 11/1980 | Davis |
| 4,331,518 A | 5/1982 | Wilson |
| 4,591,951 A | 5/1986 | Iwamoto et al. |
| 4,640,746 A | 2/1987 | Nobel et al. |
| 4,681,670 A | 7/1987 | Nobel et al. |
| 4,749,626 A | 6/1988 | Kadija et al. |
| 4,756,791 A | 7/1988 | D'Angelo et al. |
| 4,922,322 A | 5/1990 | Mathew |
| 4,935,312 A | 6/1990 | Nakayama et al. |
| 4,959,278 A | 9/1990 | Shimauchi et al. |
| 4,997,516 A | 3/1991 | Adler |
| 4,997,722 A | 3/1991 | Adler |
| 5,008,997 A | 4/1991 | Phy |
| 5,039,576 A | 8/1991 | Wilson |
| 5,049,718 A | 9/1991 | Spletter et al. |
| 5,130,275 A | 7/1992 | Dion |
| 5,160,422 A | 11/1992 | Nishimura et al. |
| 5,202,179 A | 4/1993 | Kasahara |
| 5,234,513 A | 8/1993 | Inoue et al. |
| 5,260,849 A | 11/1993 | Kasahara |
| 5,277,756 A | 1/1994 | Dion |
| 5,320,737 A | 6/1994 | Chao et al. |
| 5,322,823 A | 6/1994 | Ueda et al. |
| 5,384,204 A | 1/1995 | Yumoto et al. |
| 5,393,573 A | 2/1995 | MacKay |
| 5,439,639 A | 8/1995 | Vianco et al. |
| 5,492,595 A | 2/1996 | Carano et al. |
| 5,698,087 A | 12/1997 | Bokisa |
| 5,724,727 A * | 3/1998 | Chopra et al. .................. 29/832 |
| 5,730,851 A | 3/1998 | Arrowsmith et al. |
| 5,750,017 A | 5/1998 | Zhang |
| 5,798,286 A | 8/1998 | Faraci et al. |
| 5,807,519 A | 9/1998 | Suzuki et al. |
| 5,861,076 A | 1/1999 | Adlam |
| 5,879,568 A | 3/1999 | Urasaki et al. |
| 5,889,083 A | 3/1999 | Zhu et al. |
| 5,990,197 A | 11/1999 | Escano et al. |
| 6,010,771 A | 1/2000 | Isen et al. |
| 6,093,503 A | 7/2000 | Isoyama et al. |
| 6,099,713 A | 8/2000 | Yanada et al. |
| 6,147,400 A | 11/2000 | Faraci et al. |
| 6,165,386 A | 12/2000 | Endo et al. |
| 6,200,732 B1 | 3/2001 | Tamura et al. |
| 6,238,847 B1 | 5/2001 | Axtell et al. |
| 6,248,455 B1 | 6/2001 | Adams et al. |
| 6,297,142 B1 | 10/2001 | Mita et al. |
| 6,306,947 B1 | 10/2001 | Morishima et al. |
| 6,361,823 B1 | 3/2002 | Bokisa et al. |
| 6,426,548 B1 | 7/2002 | Mita et al. |
| 6,433,409 B2 | 8/2002 | Mita et al. |
| 6,472,459 B2 | 10/2002 | Morales et al. |
| 6,530,944 B2 | 3/2003 | West et al. |
| 6,554,914 B1 | 4/2003 | Rozbicki et al. |
| 6,583,500 B1 | 6/2003 | Abbott et al. |
| 6,603,205 B2 | 8/2003 | Miura |
| 6,638,847 B1 | 10/2003 | Cheung et al. |
| 6,646,330 B2 | 11/2003 | Kubara et al. |
| 6,651,521 B2 | 11/2003 | Carbone et al. |
| 6,664,492 B1 | 12/2003 | Babb et al. |
| 6,679,937 B1 | 1/2004 | Kodas et al. |
| 6,682,584 B2 | 1/2004 | Pozarnsky et al. |
| 6,720,499 B2 | 4/2004 | Bokisa et al. |
| 6,773,827 B2 | 8/2004 | Higuchi |
| 6,773,828 B1 | 8/2004 | Ooi et al. |
| 6,774,036 B2 | 8/2004 | Goldstein |
| 6,783,569 B2 | 8/2004 | Cheon et al. |
| 6,828,660 B2 | 12/2004 | Abbott |
| 6,860,981 B2 | 3/2005 | Schetty, III et al. |
| 6,899,775 B2 | 5/2005 | Hill et al. |
| 6,917,098 B1 | 7/2005 | Yamunan |
| 6,951,666 B2 | 10/2005 | Kodas et al. |
| 7,019,391 B2 | 3/2006 | Tran |
| 7,062,848 B2 | 6/2006 | Pan et al. |
| 7,084,067 B2 | 8/2006 | Geusic et al. |
| 7,087,523 B2 | 8/2006 | Grigoropoulos et al. |
| 7,153,775 B2 | 12/2006 | Geusic |
| 7,160,629 B2 | 1/2007 | Crosby |
| 7,179,362 B2 | 2/2007 | Dietterle et al. |
| 7,195,702 B2 | 3/2007 | Bokisa, Sr. et al. |
| 7,215,014 B2 | 5/2007 | Su et al. |
| 7,252,699 B2 | 8/2007 | Perry et al. |
| 7,262,603 B1 | 8/2007 | Benton et al. |
| 7,294,366 B2 | 11/2007 | Renn et al. |
| 7,297,902 B2 | 11/2007 | Weiss |
| 7,316,725 B2 | 1/2008 | Kodas et al. |
| 7,351,667 B2 * | 4/2008 | Hwang et al. .................. 438/745 |
| 7,357,681 B2 | 4/2008 | Yamagami et al. |
| 7,384,862 B2 * | 6/2008 | Yamazaki ..................... 438/610 |
| 7,391,116 B2 | 6/2008 | Chen et al. |
| 7,482,540 B2 | 1/2009 | Shukushima et al. |
| 7,507,618 B2 | 3/2009 | Dunbar |
| 7,547,479 B2 | 6/2009 | Wessling |
| 7,776,196 B2 | 8/2010 | Fujimoto et al. |
| 7,786,024 B2 | 8/2010 | Stumbo et al. |
| 7,867,413 B2 | 1/2011 | Lee et al. |
| 7,879,131 B2 | 2/2011 | Yaniv et al. |
| 2002/0148386 A1 | 10/2002 | Woosman et al. |
| 2002/0158342 A1 | 10/2002 | Tuominen et al. |
| 2002/0185716 A1 | 12/2002 | Abys et al. |
| 2002/0187364 A1 | 12/2002 | Heber et al. |
| 2002/0192492 A1 | 12/2002 | Abys |
| 2003/0025182 A1 | 2/2003 | Abys et al. |
| 2003/0151030 A1 | 8/2003 | Gurin |
| 2003/0168639 A1 | 9/2003 | Cheon et al. |
| 2003/0226758 A1 | 12/2003 | Egli |
| 2004/0026256 A1 | 2/2004 | Lindgren |
| 2004/0026684 A1 | 2/2004 | Empedocies |
| 2004/0118696 A1 | 6/2004 | Zhang et al. |
| 2004/0131934 A1 | 7/2004 | Sugnaux et al. |
| 2004/0132299 A1 | 7/2004 | Matsuda et al. |
| 2004/0134379 A1 | 7/2004 | Wong et al. |
| 2004/0147113 A1 * | 7/2004 | Yamazaki et al. ............. 438/660 |
| 2004/0147618 A1 | 7/2004 | Lee et al. |
| 2004/0171211 A1 * | 9/2004 | Lee et al. ...................... 438/243 |
| 2004/0175631 A1 | 9/2004 | Crocker et al. |
| 2004/0192042 A1 | 9/2004 | Sirringhaus et al. |
| 2004/0218136 A1 * | 11/2004 | Imai ............................. 349/156 |
| 2004/0232000 A1 | 11/2004 | Crosby |
| 2004/0241532 A1 | 12/2004 | Kim |
| 2004/0256239 A1 | 12/2004 | Whitlaw et al. |
| 2005/0019543 A1 | 1/2005 | Lyles |
| 2005/0078158 A1 | 4/2005 | Magdassi et al. |
| 2005/0097987 A1 | 5/2005 | Kodas et al. |
| 2005/0145502 A1 | 7/2005 | Schetty, III et al. |
| 2005/0148164 A1 | 7/2005 | Casey et al. |
| 2005/0183768 A1 | 8/2005 | Roscheisen et al. |
| 2005/0218398 A1 | 10/2005 | Tran |
| 2005/0230042 A1 | 10/2005 | Hasimoto |
| 2005/0249967 A1 | 11/2005 | Egli |
| 2005/0249968 A1 | 11/2005 | Xu et al. |
| 2005/0249969 A1 | 11/2005 | Xu et al. |
| 2005/0274480 A1 | 12/2005 | Barsoum et al. |
| 2006/0011267 A1 | 1/2006 | Kay et al. |
| 2006/0054668 A1 | 3/2006 | Severin |
| 2006/0057502 A1 | 3/2006 | Okada et al. |
| 2006/0062701 A1 | 3/2006 | Nakamura et al. |
| 2006/0068218 A1 | 3/2006 | Hooghan |
| 2006/0073680 A1 | 4/2006 | Han et al. |
| 2006/0090819 A1 | 5/2006 | Egli |
| 2006/0091121 A1 | 5/2006 | Zanolli et al. |
| 2006/0096867 A1 | 5/2006 | Bokisa et al. |
| 2006/0110424 A1 | 5/2006 | Lyles |
| 2006/0111467 A1 | 5/2006 | Reinhardt et al. |
| 2006/0141268 A1 | 6/2006 | Kalkan et al. |
| 2006/0159838 A1 | 7/2006 | Kowalski et al. |
| 2006/0163744 A1 * | 7/2006 | Vanheusden et al. ......... 257/773 |
| 2006/0183055 A1 | 8/2006 | O'Neill et al. |
| 2006/0189113 A1 | 8/2006 | Vanheusden et al. |
| 2006/0234519 A1 | 10/2006 | Pan et al. |

(56) References Cited

U.S. PATENT DOCUMENTS

| | | | |
|---|---|---|---|
| 2006/0240591 A1 | 10/2006 | Grier et al. | |
| 2006/0286301 A1 | 12/2006 | Murata et al. | |
| 2007/0007144 A1 | 1/2007 | Schetty, III | |
| 2007/0040191 A1 | 2/2007 | Bezryadin et al. | |
| 2007/0051927 A1 | 3/2007 | Itoh et al. | |
| 2007/0074316 A1 | 3/2007 | Alden et al. | |
| 2007/0095879 A1 | 5/2007 | Holmes | |
| 2007/0105395 A1 | 5/2007 | Kinzel et al. | |
| 2007/0117475 A1 | 5/2007 | Tu | |
| 2007/0144305 A1 | 6/2007 | Jablonski et al. | |
| 2007/0145375 A1 | 6/2007 | Cho | |
| 2007/0148972 A1 | 6/2007 | Hara et al. | |
| 2007/0158204 A1 | 7/2007 | Taylor et al. | |
| 2007/0163643 A1 | 7/2007 | Van Duren | |
| 2007/0166453 A1 | 7/2007 | Van Duren et al. | |
| 2007/0175296 A1 | 8/2007 | Subramanian et al. | |
| 2007/0176991 A1 | 8/2007 | Arai et al. | |
| 2007/0190326 A1 | 8/2007 | Perry et al. | |
| 2007/0218312 A1 | 9/2007 | Sakuyama et al. | |
| 2007/0275262 A1 | 11/2007 | Lin et al. | |
| 2007/0281136 A1 | 12/2007 | Hampden-Smith et al. | |
| 2007/0281249 A1* | 12/2007 | Tutt et al. | 430/315 |
| 2007/0284700 A1 | 12/2007 | Jackson et al. | |
| 2007/0287022 A1 | 12/2007 | Jackson et al. | |
| 2007/0287023 A1 | 12/2007 | Jackson et al. | |
| 2007/0287024 A1 | 12/2007 | Jackson et al. | |
| 2007/0289483 A1 | 12/2007 | Cho et al. | |
| 2007/0295530 A1 | 12/2007 | Jackson et al. | |
| 2008/0020304 A1 | 1/2008 | Schroder et al. | |
| 2008/0083950 A1 | 4/2008 | Pan et al. | |
| 2008/0143906 A1 | 6/2008 | Allemand et al. | |
| 2008/0164557 A1* | 7/2008 | Kim et al. | 257/503 |
| 2008/0169122 A1 | 7/2008 | Shiraishi et al. | |
| 2008/0193667 A1* | 8/2008 | Garbar et al. | 427/532 |
| 2008/0286488 A1 | 11/2008 | Li et al. | |
| 2008/0305268 A1 | 12/2008 | Norman et al. | |
| 2009/0142481 A1 | 6/2009 | Chopra et al. | |
| 2009/0286383 A1 | 11/2009 | Jiang et al. | |
| 2010/0000762 A1 | 1/2010 | Yang et al. | |
| 2010/0035375 A1 | 2/2010 | Grigoropoulos et al. | |
| 2010/0301337 A1* | 12/2010 | Rider et al. | 257/57 |
| 2011/0043965 A1 | 2/2011 | Yaniv et al. | |

FOREIGN PATENT DOCUMENTS

| | | |
|---|---|---|
| JP | 10-308119 | 11/1998 |
| JP | 11-319538 | 11/1999 |
| JP | 2001-325831 | 11/2001 |
| JP | 2008006513 | 1/2008 |
| WO | 03106573 A1 | 12/2003 |
| WO | 2004005413 A1 | 1/2004 |
| WO | 2006072959 | 7/2006 |

OTHER PUBLICATIONS

The State Intellectual Property Office of the People's Republic of China, Notice on the First Office Action, Application No. 200980125925.6, Mar. 31,2012, 8 pages, CN.

Kogelschatz, "Excimer Lamps: History, Discharge Physics, and Industrial Applications", Proc. SPIE, vol. 5483, 2004. pp. 272-286.

Kim et al., "Cyclic Properties of Si-Cu/Carbon Nanocomposite Anodes for Li-Ion Secondary Batteries", Journal of the Electrochemical Society, vol. 152. No. 3, pp. A-523-A-526, Jan. 24, 2005, retrieved from internet Aug. 26, 2010.

International Search Report and the Written Opinion of the International Searching Authority for PCT/US10/042169, mailed on Sep. 7, 2010, 4 pages.

Yaniv, "Novel Inkettable Copper Ink Utilizing Processing Temperatures Under 100 Degrees C Without the Need of Inert Atmosphere", Presentation at Printed Electronics Europe Conference, pp. 1-25, Apr. 7-8, 2009, retrieved from internet Aug. 26, 2010.

International Preliminary Report on Patentability, PCT/US2010/042169, Jan. 17, 2012.

Notice on the First Office Action; Patent Application No. 200980108344.1, Jan. 21, 2012.

TEGO 425 Datasheet; http://evonik.tego.de/pdf/daten/amer/Flow_425.pdf.

United States Patent & Trademark Office, Final Office Action Summary, U.S. Appl. No. 12/391,817, dated Aug. 27, 2012.

United States Patent & Trademark Office, Non-Final Office Action Summary, U.S. Appl. No. 12/496,453, dated Jun. 13, 2012.

European Patent Office, Examination Report, Application No. 08 755 692.4, Apr. 13, 2012.

Champion et al., "Sintering of copper nanopowders under hydrogen: an in situ X-ray diffraction analysis", Materials Science and Engineering A, vol. 360, No. 1-2, Nov. 1, 2003, pp. 258-263.

Schroder et al., "Broadcast Photonic Curing of Metallic Nanoparticle Films," Nanotechnologies, Inc. publication, 2006 NSTI Nanotechnology Conference and Trade Show, May 7-11, 2006, 4 pages.

Lu et al., "Ultrahigh Strength and High Electrical Conductivity in Copper," Science Magazine, Apr. 2004, vol. 304, 6 pages.

Volkman et al., "Ink-jetted Silver/Copper Conductors for printed RFID Applications," Materials Research Society Magazine, 2004, vol. 814, 6 pages.

Wu et al., "One-Step Green Route to Narrowly Dispersed Copper Nanocrystals," Journal of Nanoparticle Research, 2006, pp. 965-969, 5 pages.

Curtis et al., "Spray and Inkjet Printing of Hybrid Nanoparticle-Metal-Organic Inks for Ag and Chu Metallizations," Materials Research Society Magazine, 2001, vol. 676, 6 pages.

Shacham-Diamond, "Electroless Copper Deposition Using Glyoxylic Acid as Reducing Agent for Ultralarge Scale Integration Metallization," manuscript published by Electrochemical and Solid-State Letters, Apr. 2000, pp. 279-282, 4 pages.

Yeshchenko et al., "Size-Dependent Melting of Spherical Copper Nanoparticles" article published by National Taras Shevchenko Kyiv University, Jan. 2007, 16 pages.

Virang G. Shah, "Trimming and Printing of Embedded Resistors Using Demand-Mode Ink-Jet Technology and Conductive Polymer," IPC Printed Circuit Expo Mar. 24-28, 2002, pp. 1-5.

International Search Report for PCT/US08/63890, Aug. 6, 2008, 9 pages.

International Search Report and Written Opinion for Application No. PCT/US/09/35717, May 5, 2009, 7 pages.

Niizeki et al., "Laser Sintering of Ag Nanopaste Film and Its Application to Bond-Pad Formation," 2008 Electronic Components and Technology Conference, May 27-30, 2008, IEEE, pp. 1745-1750.

Lee et al., "Spontaneous Growth Mechanism of Tin Whiskers," Acta mater. vol. 46, No. 10, pp. 3701-3714, 1998.

Gaylon, "Annotated Tin Whisker Bibliography and Anthology," IEEE Transactions on Electronics Packaging Manufacturing, vol. 28, No. 1, Jan. 2005, pp. 94-122.

Lal et al., "Role of Intrinsic Stresses in the Phenomena of Tin Whiskers in Electrical Connectors," IEEE Transactions on Electronics Packing Manufacturing, vol. 28, No. 1, Jan. 2005, pp. 63-74.

Boettinger et al., "Whisker and Hillock Formation on Sn, Sn-Cu and Sn-Pb Electrodeposits," Acta Materialia, 53, Sep. 8, 2005, pp. 5033-5050.

Mitooka et al., "Effect of Laser Irradiation on Generation and Growth of Whiskers in Tin-Electroplated Film," J. Japan Inst. Metals, vol. 73, No. 3, (2009), pp. 226-233.

Osenbach et al., "Sn Corrosion and Its Influence on Whisker Growth," IEEE Transactions on Electronic Packaging Manufacturing, vol. 30, No. 1, Jan. 2007, pp. 23-35.

Osenbach et al., "Sn Whiskers: Material, Design, Processing, and Post-Plate Reflow Effects and Development of an Overall Phenomenological Theory," IEEE Transactions on Electronics Packaging Manufacturing, vol. 28, No. 1, Jan. 2005, pp. 36-62.

Osterman, "Mitigation Strategies for Tin Whiskers," Release 1.0, Aug. 28, 2002, 11 pages.

Schroeder et al., "Tin Whisker Test Method Development," IEEE Transactions Electronics Packaging Manufacturing, vol. 29, No. 4, Oct. 2006, pp. 231-238.

International Search Report and Written Opinion for International Application No. PCT/US09/44196, Jun. 30, 2009, 8 pages.

(56) References Cited

OTHER PUBLICATIONS

International Search Report and Written Opinion for International Application No. PCT/US09/44195, Jun. 25, 2009, 7 pages.

International Preliminary Report on Patentability, International Application No. PCT/US2009/044196, Nov. 25, 2010, 6 pages.

International Preliminary Report on Patentability, International Application No. PCT/US2009/044195, Nov. 25, 2010, 5 pages.

International Search Report and Written Opinion for International Application No. PCT/US09/49510, Oct. 19, 2009.

International Preliminary Report on Patentability, PCT/US2008/063890, Dec. 3, 2009.

International Search Report and Written Opinion of the International Searching Authority for PCT/US10/28799, May 19, 2010.

International Search Report and the Written Opinion of the International Searching Authority for PCT/US10/28811, May 18, 2010.

MSDS: Fluorad by 3M, Fluorosurfactant FC-4430, Mar. 2, 2002; www.3m.com/paintsandcoatings, 4 pages.

Supplemental European Search Report; Application No. EP 09774505, Jun. 29, 2011.

Notice of the First Office Action, Application No. 200880021733.6, Jun. 22, 2011.

Supplementary European Search Report, Application No. EP08755692, dated Aug. 6, 2010.

Korean Intellectual Property Office, Chemistry & Biotechnology Examination Bureau, Notice to File a Response, Patent Application No. 10-2010-7022240, May 8, 2012, KR.

* cited by examiner

FIG. 1

Copper ink on Kapton sample

FIG. 4 Laser sintered lines on Kapton substrate

FIG. 5 Enlarged laser sintering

BUFFER LAYER TO ENHANCE PHOTO AND/OR LASER SINTERING

This application claims priority to U.S. Provisional Patent Applications Ser. Nos. 61/174,758 and 61/163,894.

BACKGROUND INFORMATION

The microelectronics and semiconductor packaging industries have begun to shift to printable electronics. Electronics circuits comprise a variety of components that are electrically connected to each other. Such electrical connections between different components may be made of conductive metal traces that can be printed on substrates with conductive inks The inks are processed and sintered after deposition on a substrate in order to become conductive. Thermal sintering uses a high temperature (e.g., ≥250° C.) to fuse the nanoparticles in the inks Photonic (photo) and laser sintering utilize a very high intensity lamp/laser to fuse the nanoparticles in a very short period of time (e.g., microseconds) with a low temperature and so as not to damage the underlying substrates. However, the photo/laser sintering process has limits that require low thermal conductivity material for substrates in order for the nanoparticles to effectively absorb energy and sinter before heat energy dissipates into the substrate. In other words, the substrates that can be used in these applications will be very limited for low thermal conductivity materials.

On the other hand, low thermal conductive substrates can be used for flexible printable electronics. Low temperature melting point materials such as polyethylene (PE), polyester (PET), etc., will prevent the nanoparticle inks from proper sintering, and the substrates will be damaged, with the result that the resistivity will be very high.

DETAILED DESCRIPTION

Embodiments of the present invention disclose a photo sintering process to effectively sinter metallic nanoparticles on a polyimide substrate, thus causing the film to be very conductive near the bulk material. On other hand, the photo sintering process does not perform well on nanoparticle inks coated on substrates possessing a high thermal conductivity, such as ceramics and silicon wafer. Table 1 shows the thermal conductivity for a variety of materials.

TABLE 1

| item # | material | density (g/cm$^3$) | heat capacity (J/g·K) | heat conductivity (W/m·K) | thermal effusivity | melting point, C. degrees |
|---|---|---|---|---|---|---|
| 1 | air | 0.0013 | 1 | 0.025 | 0.00 | NA |
| 2 | paper | 0.33 | 0.73 | 0.030 | 0.01 | NA |
| 3 | Polyimide (kapton) | 1.42 | 1.09 | 0.120 | 0.19 | NA |
| 4 | PMMA (resist) | 1.19 | 1.46 | 0.160 | 0.28 | 180 |
| 5 | PET (Mylar) | 1.23 | 1.13 | 0.176 | 0.24 | 150 |
| 6 | LCP (liquid crystal polymer) | 1.4 | 1.6 | 0.500 | 1.12 | 300 |
| 7 | PE (polyethylene, high density) | 0.95 | 2.3 | 0.500 | 1.09 | 125 |
| 8 | water | 1 | 4.2 | 0.600 | 2.52 | 0 |
| 9 | glass | 2.3 | 0.753 | 1.330 | 2.30 | 950 |
| 10 | SiO$_2$ | 2.2 | 0.75 | 1.380 | 2.28 | 1600 |
| 11 | MgO | 3.2 | 0.84 | 5.900 | 15.86 | 2852 |
| 12 | carbon-amorphous | 1.51 | 0.707 | 6.280 | 6.70 | 3600 |
| 13 | Si$_3$N$_4$ | 2.8 | 0.69 | 7.950 | 15.36 | 1900 |
| 14 | TiO$_2$ | 4.25 | 0.69 | 9.000 | 26.39 | 1843 |
| 15 | CuO/Cu$_2$O | 6.5 | 0.536 | 18.000 | 62.71 | 1235 |
| 16 | Ti | 4.5 | 0.523 | 21.000 | 49.42 | 1668 |
| 17 | Al$_2$O$_3$ (ceramics) | 2.5 | 0.81 | 30.000 | 60.75 | 2054 |
| 18 | solder (60/40 Sn/Pb) | 8.5 | 0.197 | 50.210 | 84.08 | 185 |
| 19 | Ni | 8.9 | 0.444 | 88.000 | 347.74 | 1455 |
| 20 | Mo | 10.2 | 0.25 | 134.000 | 341.70 | 2623 |
| 21 | Si | 2.33 | 0.7 | 148.000 | 241.39 | 1414 |
| 22 | carbon-graphite | 2.25 | 0.707 | 167.360 | 266.23 | 3600 |
| 23 | Al | 2.7 | 0.88 | 209.000 | 496.58 | 660 |
| 24 | Au | 19.3 | 0.13 | 318.000 | 797.86 | 1086 |
| 25 | Cu | 8.9 | 0.385 | 398.000 | 1363.75 | 1064 |

TABLE 1-continued

| item # | material | density (g/cm³) | heat capacity (J/g · K) | heat conductivity (W/m · K) | thermal effusivity | melting point, C. degrees |
|---|---|---|---|---|---|---|
| 26 | carbAL | 2.3 | 0.75 | 425.000 | 733.13 | 3600 |
| 27 | Ag | 10.5 | 0.24 | 427.000 | 1076.04 | 962 |
| 28 | carbon-diamond | 3.51 | 0.506 | 543.920 | 966.03 | 3800 |
| 29 | carbon nanotubes | | | 6000.000 | | |

Low conductivity materials, such as polyimide, can be used as a coating material onto other high thermal conductivity substrates, such as ceramics and silicon wafer, in order to isolate heat energy dissipation from nanoparticles during a photo sintering process so that the nanoparticles are fused more effectively. How quickly heat dissipates depends on the thickness of the low thermal conductivity material (e.g., polyimide film).

The following experiment was conducted for showing how the present invention operates. Three wafers were spin coated with 1, 1.5, and 2.3 microns thick DuPont PI-2610 polyimide, respectively, and thermal cured at 350° C. for 30 minutes. One bare silicon wafer was used for a reference (wafer #1). All four wafers were coated with copper ink using a drawdown process. After a 60 minute drying process at 100° C., each wafer was divided into three zones that were individually sintered with three different energy levels. The resistance for each zone and each wafer was measured with a voltmeter, with the results shown in Table 2, which shows the electrical resistances of a copper film after photo sintering with various coating thicknesses of polyimide on silicon wafers.

TABLE 2

Figure 1:
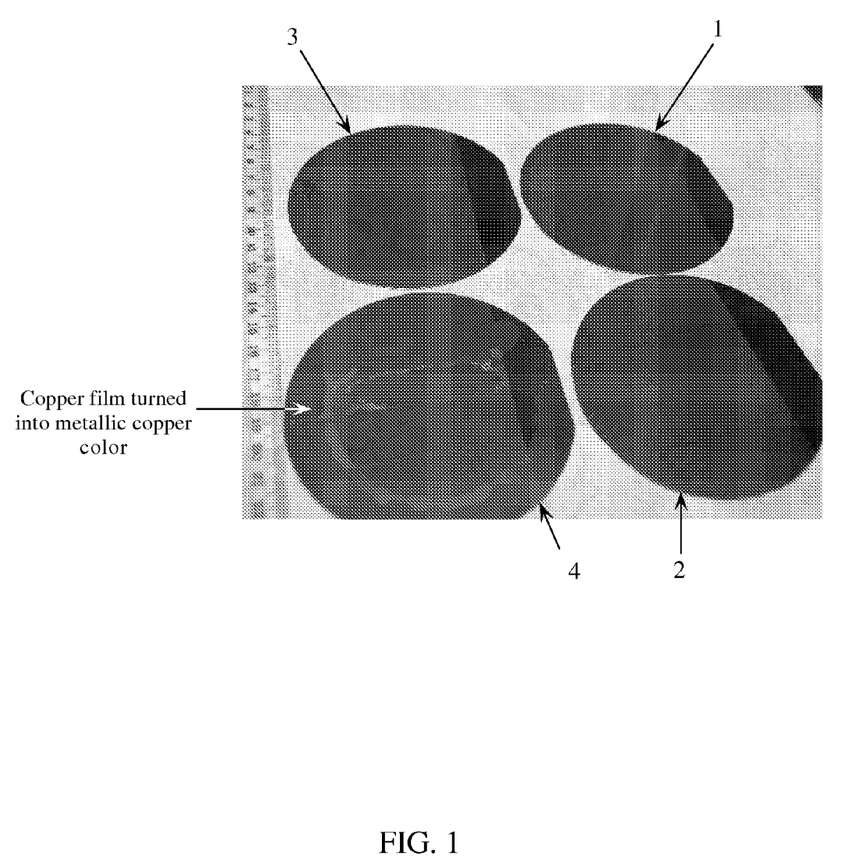
FIG. 1 is a digital photo showing copper inks photo sintered on four silicon wafers.

| wafer # | polyimide thickness (μm) | copper ink (μm) | Zone 1: resistance with energy 1 | Zone 2: resistance with energy 2 | Zone 3: resistance with energy 3 |
|---|---|---|---|---|---|
| 1 | 0 | 3.2 | >20 MΩ | >20 MΩ | >20 MΩ |
| 2 | 1 | 3.2 | >20 MΩ | >20 MΩ | >20 MΩ |
| 3 | 1.5 | 3.2 | >20 MΩ | >20 MΩ | >20 MΩ |
| 4 | 2.3 | 3.2 | >20 MΩ | >20 MΩ | 20 Ω | where
energy 1 = 3 sinter shots with 850/1050 V, 1000 μsec
energy 2 = 4 sinter shots with 850/1150 V, 1000 μsec
energy 3 = 5 sinter shots with 850/1250 V, 2000 μsec Except for zone 3 of wafer 4, all zones from the four wafers did not experience a change in resistance after photo sintering. Zone 3 of wafer 4 experienced a change in its metallic color at the highest energy level, as shown in FIG. 1. The area had a severe blow off. The surrounding area had copper debris left that was conductive. This is clear evidence that the polyimide material may be used as a thermal insulator. The thickness of polyimide may be more than 3 microns. The thermal conductivity is 0.12 and 148 W/m·K for polyimide and silicon, respectively. The heat dissipated into the silicon substrate (wafer #1) too quickly to sinter the copper nanoparticles since there was no polyimide material.

Wafers 1, 2, and 3 all had high resistance (greater than 20 mega ohms). Wafer 4 at the center zone with 20 ohms resistance as shown in FIG. 1 appeared that the copper nanoparticles film started to be fused, sintered, and turned into a copper color. The thicker low thermal conductivity material can thus be used as a good thermal insulator.

Figure 2:
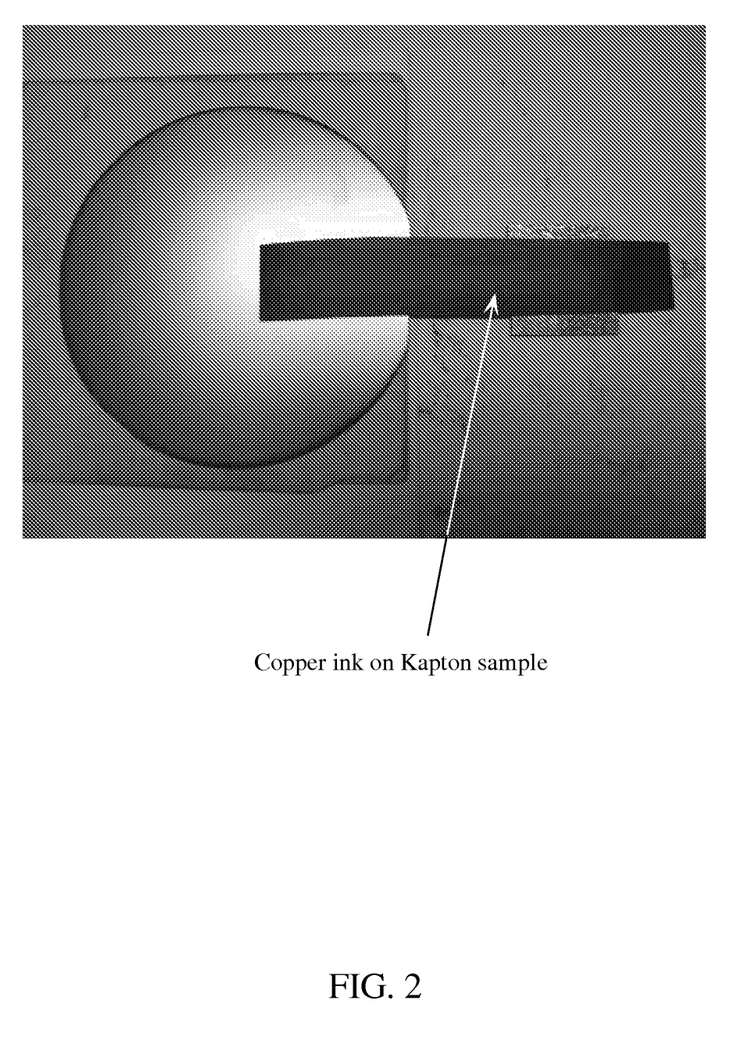
FIG. 2 is a digital photo showing copper inks before being photo sintered.
Figure 3:
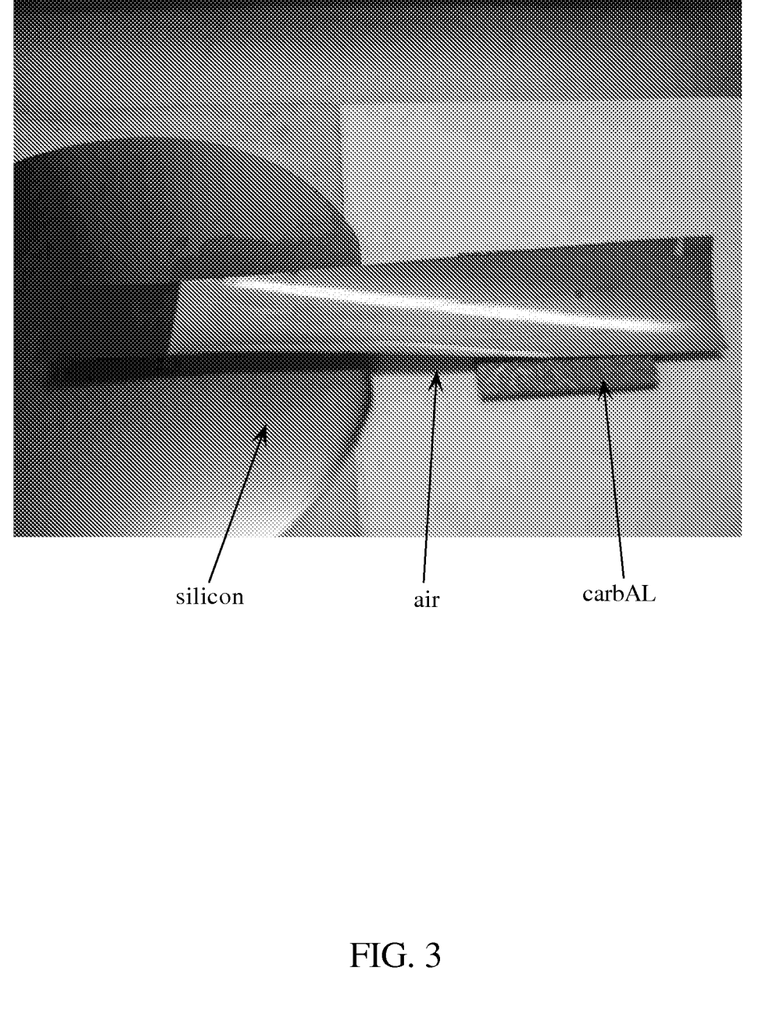
FIG. 3 is a digital photo showing copper inks after being photo sintered.

In addition to the liquid polyimide disclosed above, a dry polyimide film was also utilized. The copper ink was coated on a 50 micron polyimide film (Kapton). The sample was placed on a silicon wafer and a carbAL high thermal conductive heat sink, as shown in FIG. 2. Silicon grease was coated in between the Kapton and the silicon wafer and carbAL to ensure good thermal contact. The sample was photo sintered simultaneously in a single shot. The copper was sintered very well and turned a shiny copper color, as shown in FIG. 3. It did not matter what materials the Kapton was residing on. At least a 50 micron thick polyimide is sufficiently thick to isolate and prevent heat energy dissipation for photo sintering processes, though a thickness of less than 50 microns may be utilized for embodiments where less conductivity is desired of the conductive traces.

Figure 4:
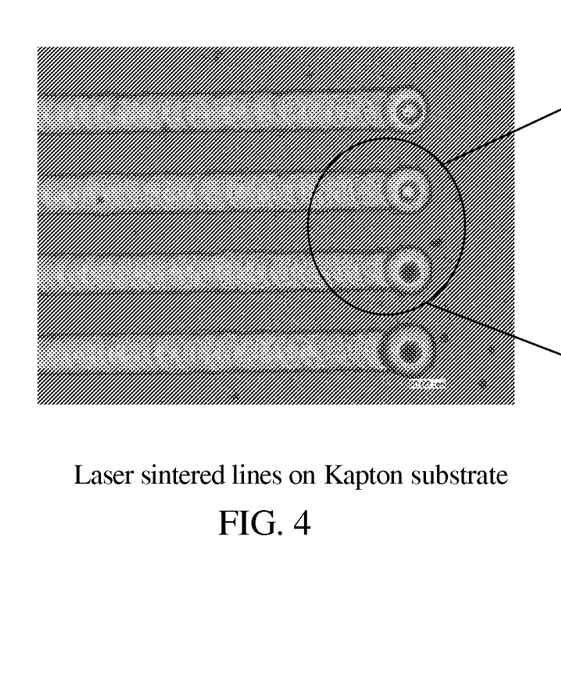
FIG. 4 is a digital photo showing laser sintered lines on a Kapton substrate.
Figure 5:
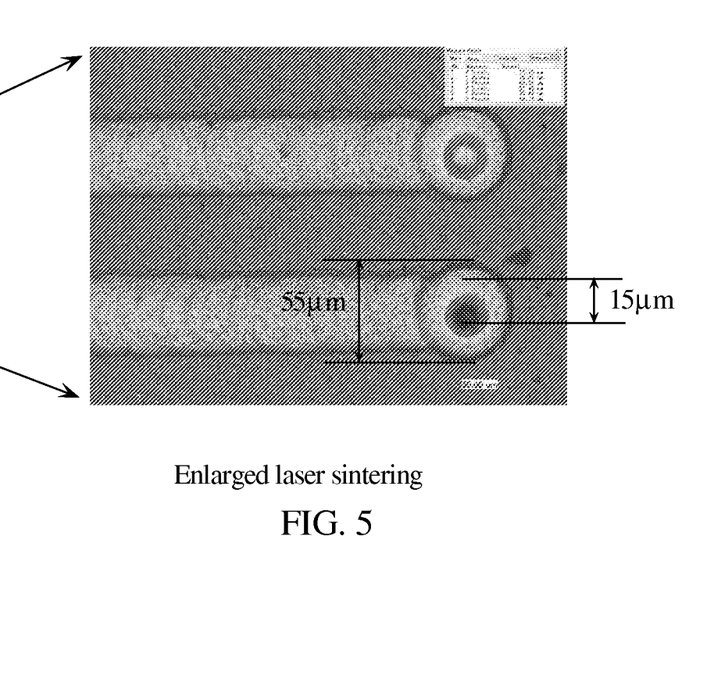
FIG. 5 is an enlarged digital photo showing the laser sintered lines of FIG. 4.

In addition, laser sintering was utilized on silicon wafers with the same setup as described above. The laser was a solid state diode with an 830 nm wavelength and an 800 mW power. The focus beam size was 15 microns in diameter and controlled by a collimator and an objective lens, as shown in FIGS. 4 and 5.

Figure 6:
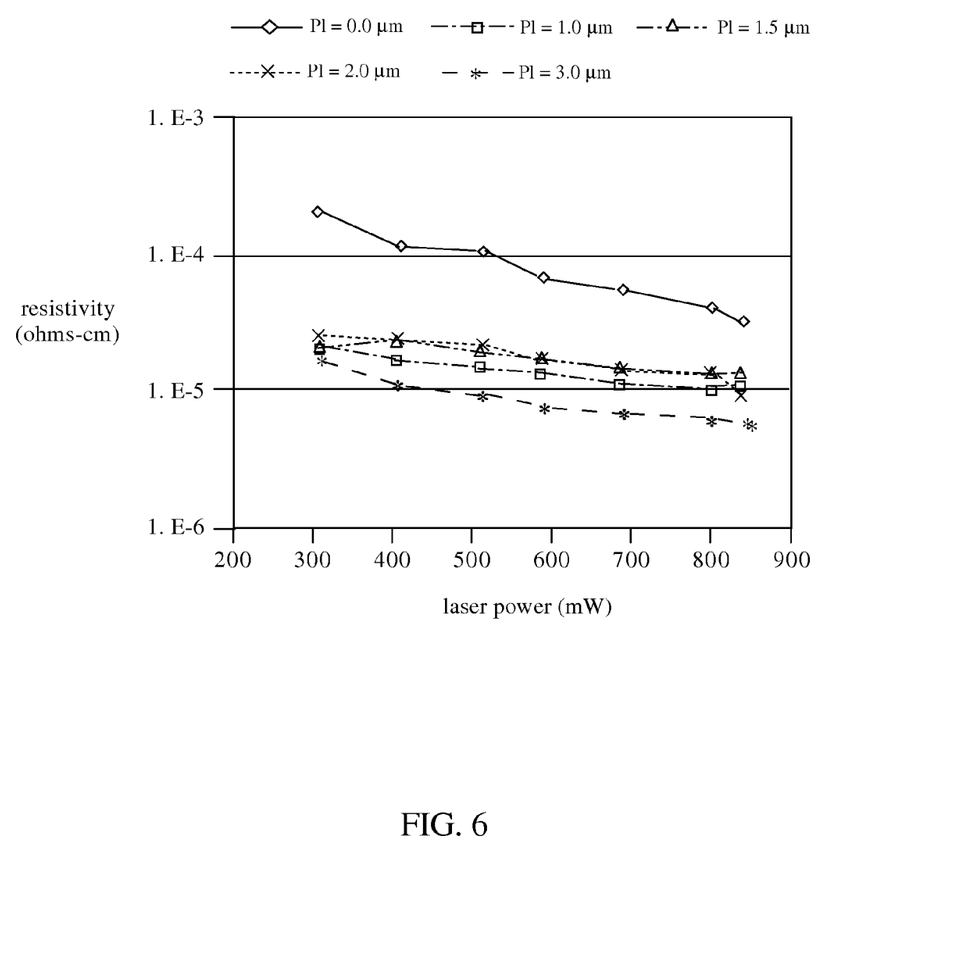
FIG. 6 illustrates a graph showing that copper ink resistivity sintered by a laser is not only inversely proportional to laser power, but also inversely proportional to buffer layer thickness made of polyimide.

This laser had sufficient power to sinter and fuse the nanoparticles and turn the copper ink conductive. There were four silicon wafers coated with various polyimide thicknesses of 1, 1.5, 2, and 3 microns, respectively, along with a bare silicon wafer as a reference. The resistivity of each wafer is plotted with laser power in FIG. 6, which indicates that the copper film conductivity is proportional to the polyimide thickness, and the heat generated by the laser is transferred to the substrate less with polyimide present than the bare silicon wafer without polyimide. This is clear evidence that any material having a low thermal conductivity, such as polyimide material, may be used as a thermal insulator and enhance the photo and laser sintering processes.

Furthermore, a variety of polyimide thicknesses were coated on silicon wafers and cured at 350° C. for one hour. Then the standard copper ink was coated by drawdown, dried in an oven, and photo/laser sintered. Electrical measurements were performed and characterized the copper ink samples.

Figure 7:
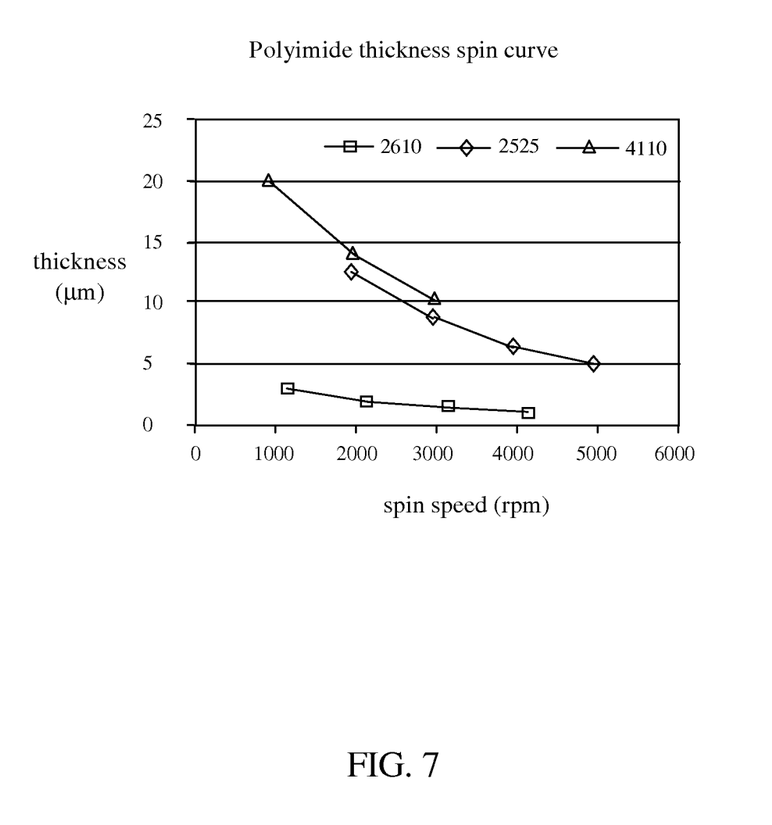
FIG. 7 illustrates a graph showing thicknesses of cured polyimide measured at various spin speeds.

Three types of polyimide material made by DuPont were used to spin coat on silicon wafer at 1000, 2000, 3000, 4000 and 5000 rpm. FIG. 7 illustrates a graph showing thicknesses of cured polyimide measured at various spin speeds. The range was from 1 to 20 microns on each wafer, respectively.

After samples were prepared, both photo and laser sintering were performed on the copper inks Different types of sintering were compared versus resistivity and adhesion, as well as line width for laser sintering. Table 3 shows samples photo sintered at the same energy level with various thicknesses of polyimide. Table 4 shows samples laser sintered at a fixed power level with various thicknesses of polyimide.

TABLE 3

| sample # | polyimide thickness (μm) | Cu ink thickness (μm) | resistivity (ohm-cm) | adhesion (1-10) |
|---|---|---|---|---|
| 1 | 0 | 3 | 3.00E+01 | 1 |
| 2 | 5 | 2 | 1.30E−04 | 2 |
| 3 | 6.5 | 2 | 4.00E−05 | 4 |
| 4 | 8.7 | 2 | 1.60E−05 | 7 |
| 5 | 12.5 | 2 | 1.52E−05 | 7 |
| 6 | 10 | 1.5 | 1.50E−05 | 8 |
| 7 | 14 | 1.5 | 1.40E−05 | 8 |
| 8 | 20 | 1.5 | 1.14E−05 | 8 |

TABLE 4

| sample # | polyimide thickness (μm) | resistivity (ohm-cm) at 840 mW | adhesion (1-10) | line width (μm) at 840 mW | line width (μm) at 409 mW |
|---|---|---|---|---|---|
| 11 | 0 | 1.60E−04 | 1 | 70 | 35 |
| 12 | 1 | 1.26E−05 | 5 | 74 | 38 |
| 13 | 1.5 | 1.36E−05 | 5 | 77 | 39 |
| 14 | 2 | 9.33E−06 | 3 | 83 | 40 |
| 15 | 3 | 6.00E−06 | 1 | 88 | 42 |
| 16 | 5 | 4.75E−06 | 8 | 92 | 65 |
| 17 | 7 | 4.82E−06 | 8 | 103 | 75 |
| 18 | 12 | 3.61E−06 | 8 | 150 | 88 |
| 19 | 20 | 5.47E−06 | 8 | 180 | 120 |

Figure 8:
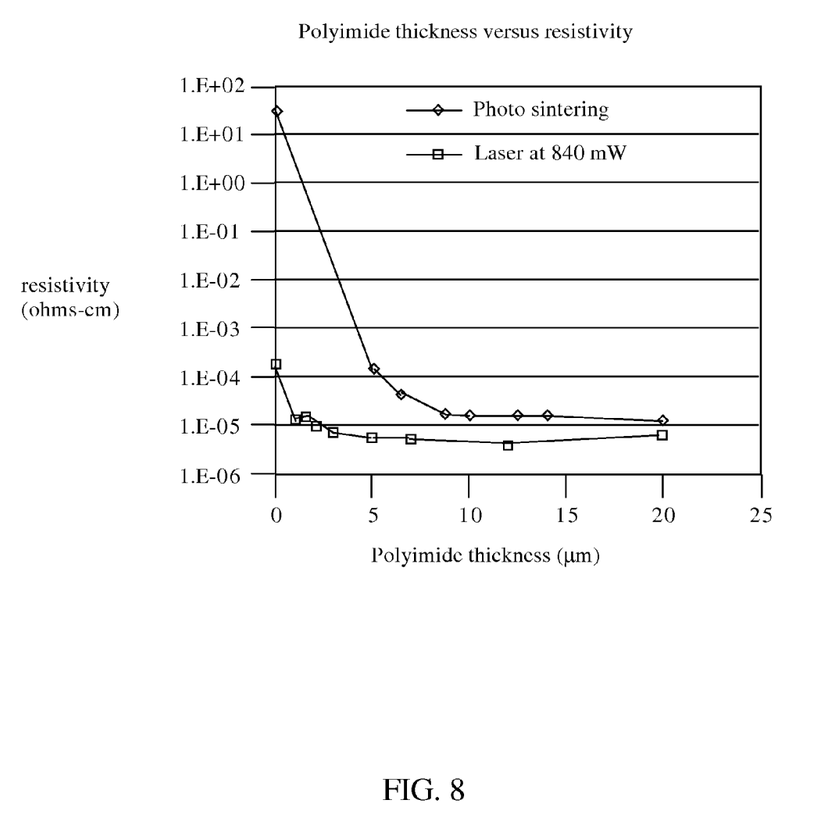
FIG. 8 illustrates a graph showing that resistivity of sintered copper film is inversely proportional to polyimide thickness.

FIG. 8 illustrates a graph showing that resistivity of sintered copper film is inversely proportional to polyimide thickness. The saturated points for resistivity are approximately at 10 microns for photo sintering and approximately at 5 microns for laser sintering. Power density of photo sintering is much lower than that of laser sintering, providing a reason why its resistivity is higher.

Figure 9:
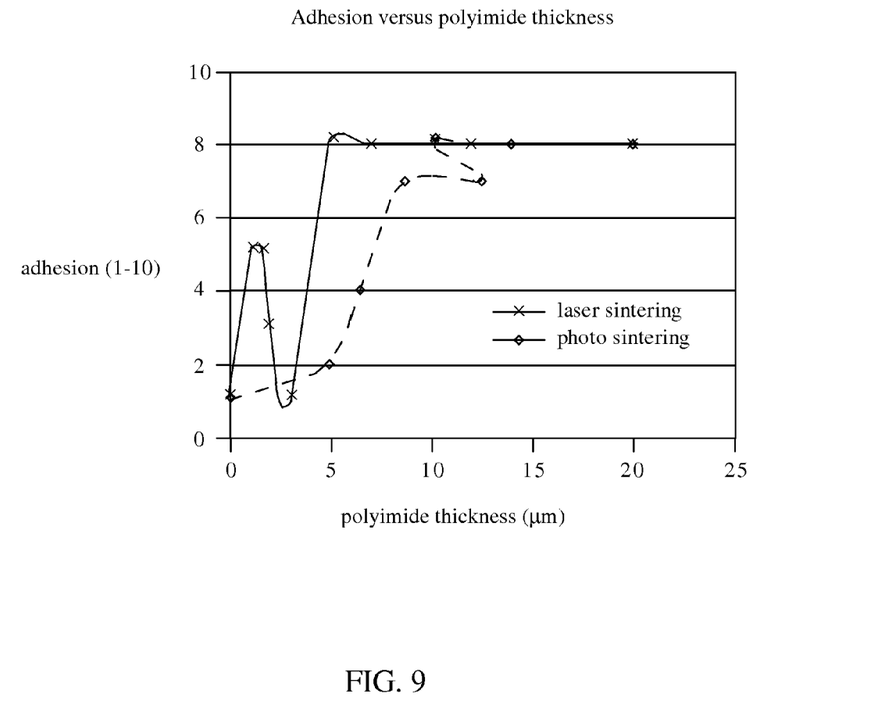
FIG. 9 illustrates a graph showing that adhesion of copper ink film to polyimide is proportional to polyimide thickness.

FIG. 9 illustrates a graph showing that adhesion of copper ink film to polyimide is proportional to polyimide thickness. There are some noise points, but the trend is clear from the graph. The thicker the polyimide is, the better the adhesion is. Again, critical points of polyimide thickness for the good adhesion are approximately at 10 microns for photo sintering and approximately at 5 microns for laser sintering.

Figure 10:
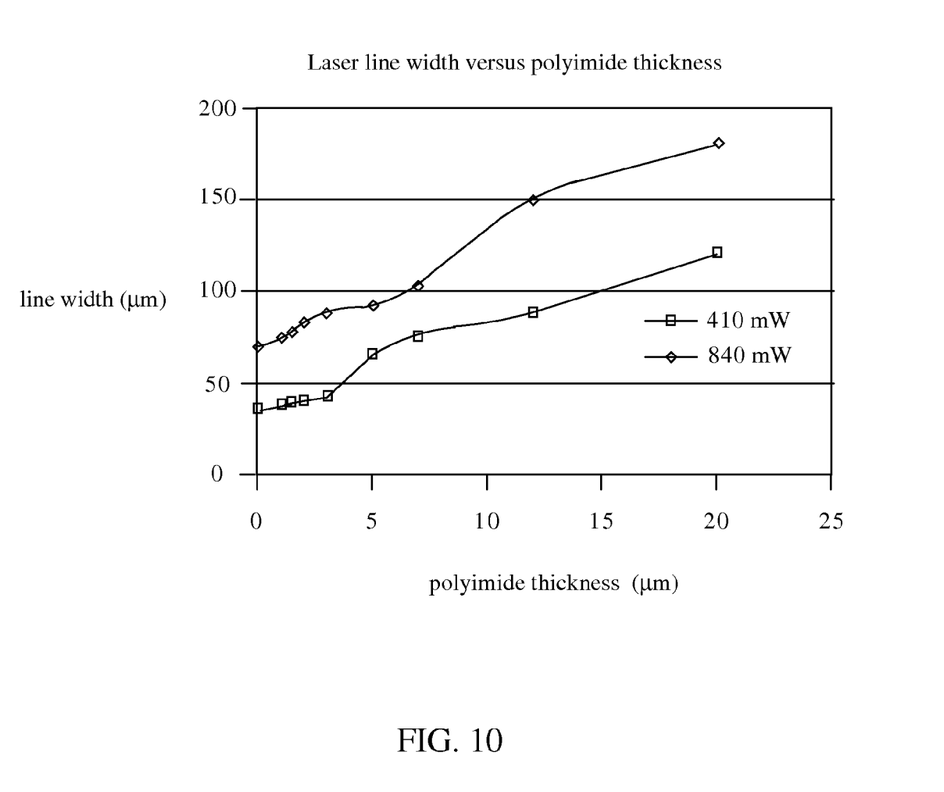
FIG. 10 illustrates a graph showing that laser writing line width is proportional to the laser power density.

FIG. 10 illustrates a graph showing that laser writing line width is proportional to the laser power density. With given laser power, the laser writing line width is also proportional to the polyimide film thickness, providing more evidence that polyimide is a good thermal insulator for these processes. The laser energy and heat deposited on the copper ink surface could not spread any deeper vertically but laterally while the polyimide thickness increased.

Figure 11A:
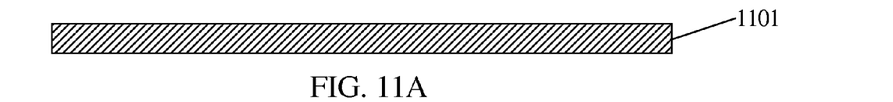
FIGS. 11A-11F illustrate a process in accordance with embodiments of the present invention.
Figure 11B:
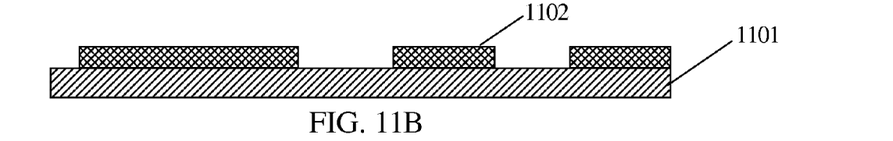
Figure 11C:
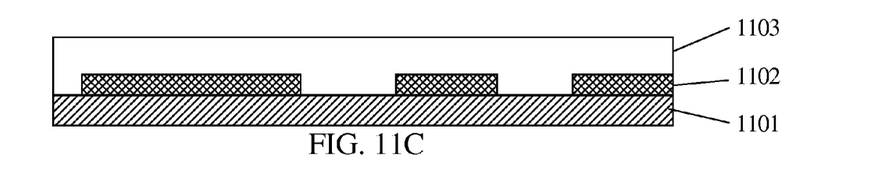
Figure 11D:
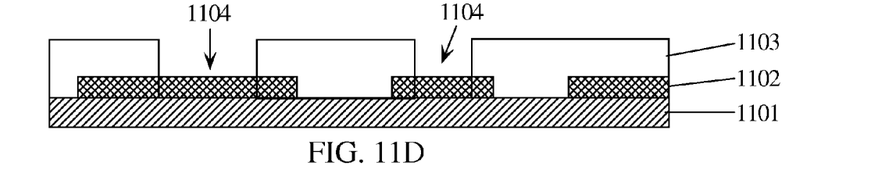
Figure 11E:
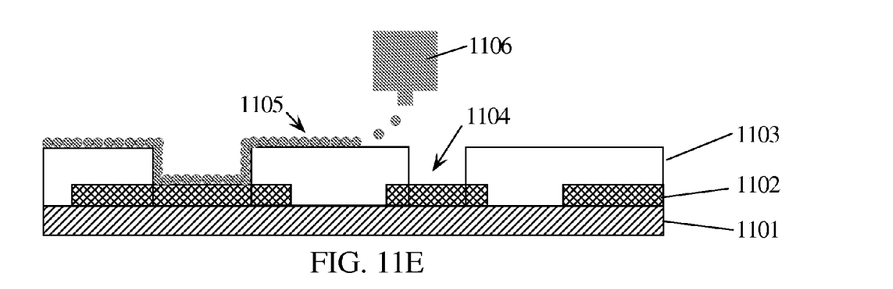
Figure 11F:
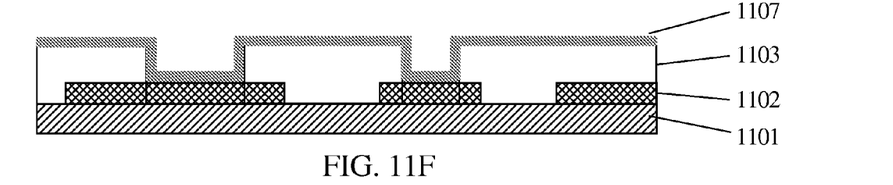

Referring to FIGS. 11A-11F, a process for performing embodiments of the present invention is illustrated. A substrate 1101 is provided on which electronic circuitry is to be mounted. In FIG. 11B, traces of a metal material 1102 are deposited in a desired pattern on the substrate 1101, using a well-known manufacturing process. In FIG. 11C, a layer of low thermal conductivity material 1103, such as polyimide, is coated over the metal traces 1102 and substrate 1101. To create further patterns for the conductive traces to be deposited, vias 1104 are formed through the material 1103, exposing portions of the metal traces 1102. In FIG. 11E, an ink jet apparatus 1106 deposits a conductive ink 1105, such as copper nanoparticles, over the material 1103 and the metal traces 1102 exposed by the vias 1104. In FIG. 11F a photo or laser sintering process is performed on the deposited conductive ink nanoparticles 1105 to sinter them into conductive traces 1107, as described herein. Depositing of the conductive inks and the sintering processes are described in U.S. Patent Publication No. 2008/0286488 A1, which is hereby incorporated by reference herein.

Summary

1. The effectiveness of a photo sintering process depends on not only metallic nanoparticle size, but also the type of substances.

2. Effective photo sintering is achieved with nanoparticles below 300 nm.

3. The thermal conductivity of substrates will affect metallic ink photo sintering. The lower the thermal conductivity of the substrate, the better the electrical conductivity of the nanoparticle film.

4. High thermal conductive substrates can be tailored and isolated by coating low thermal conductivity material, such as polyimide or polymer, for an effective photo sintering process.

5. The thickness of coating of polyimide required to isolate thermal heat dissipation is approximately 1-50 microns.

6. The copper ink becoming a conductive film has been demonstrated on high thermal conductive material such as silicon wafer with both laser and photo sintering.

7. Heat dissipation on high thermal conductive silicon wafers has been shown with a variety of polyimide thicknesses coated on a wafer. A low thermal conductive material can be used as a buffer layer to slow down heat dissipation and enhance the photo or laser sintering.

8. Copper ink may be sintered well with polyimide coated on a silicon wafer with resistivity at $1 \times 10^{-5}$ ohm-cm by photo sintering and $4 \times 10^{-6}$ ohm-cm by laser sintering.

9. The polyimide material may be not only utilized as a heat insulator on high thermal conductive substrates and enhance copper ink photo and laser sintering effectiveness, but also applied to low melting temperature substrates as a heat insulator to protect from heat damage during a sintering process.

10. Polyimide layer and metal trace layer can be repeated several times as multilayer circuits.

11. Polyimide layer can be used as a dielectric material and incorporated as capacitors.

12. Nano-copper ink can be used at top layer conductor as a contact metal in two-dimensional and three-dimensional chip packaging applications.

What is claimed is:

1. A method for depositing conductive lines on a substrate comprising:
   depositing a metal layer in a pattern on the substrate;
   coating a layer of material having a low thermal conductivity over the pattern metal layer and the substrate;
   depositing a film of conductive ink over the layer of material having the low thermal conductivity; and
   sintering the film of conductive ink.

2. The method as recited in claim 1, further comprising:
   forming a via through the layer of material having the low thermal conductivity thereby exposing a portion of the patterned metal layer, wherein the depositing of the film of conductive ink includes depositing the film of conductive ink into the via to thereby coat the portion of the patterned metal layer with the film of conductive ink, wherein the film of conductive ink coating the portion of the patterned metal layer is also sintered.

3. The method as recited in claim 1, wherein the substrate has a thermal conductivity greater than the layer of material having the low thermal conductivity.

4. The method as recited in claim 2, wherein the film of conductive ink coated over the portion of the patterned metal layer does not dissipate as much energy from the sintering as the film of conductive ink coated over the layer of material having the low thermal conductivity.

5. The method as recited in claim 4, wherein the layer of material having the low thermal conductivity comprises a polymer.

6. The method as recited in claim 4, wherein the layer of material having the low thermal conductivity comprises polyimide.

7. The method as recited in claim 6, wherein the polyimide has a thickness of at least 50 microns.

8. The method as recited in claim 6, wherein the sintering is performed with a photo sintering apparatus.

9. The method as recited in claim 6, wherein the sintering is performed with a laser sintering apparatus.

10. The method as recited in claim 6, wherein the polyimide has a thickness of at least 5 microns.

11. The method as recited in claim 6, wherein the polyimide has a thickness of at least 2.3 microns.

12. The method as recited in claim 6, wherein the substrate comprises silicon.

13. The method as recited in claim 6, wherein the substrate comprises ceramic.

14. The method as recited in claim 6, wherein the film of conductive ink comprises copper nanoparticles.

15. The method as recited in claim 9, wherein the laser sintering apparatus comprises a solid state diode with an 830 nm wavelength and 800 mW power.

16. The method as recited in claim 15, wherein the solid state diode has a focus beam size of 15 microns in diameter.

17. Electronic circuitry comprising:
a substrate;
a pattern of metal traces deposited on the substrate;
a layer low thermal conductive material coated over the substrate and the pattern of metal traces deposited on the substrate, wherein vias are formed through the layer of low thermal conductive material over portions of the pattern of metal traces; and
a film of sintered conductive ink coated over the layer of low thermal conductive material coated over the substrate, wherein the film of sintered conductive ink is coated over the portions of the pattern of metal traces within the vias formed through the layer of low thermal conductive material.

18. The electronic circuitry as recited in claim 17, wherein the substrate has a thermal conductivity greater than the layer of low thermal conductive material.

19. The electronic circuitry as recited in claim 18, wherein the layer of low thermal conductive material comprises polyimide.

20. The electronic circuitry as recited in claim 19, wherein the polyimide has a thickness of at least 50 microns.

21. The electronic circuitry as recited in claim 19, wherein the sintered conductive ink comprises sintered copper nanoparticles sintered with a photo sintering apparatus.

22. The electronic circuitry as recited in claim 19, wherein the sintered conductive ink comprises sintered copper nanoparticles sintered with a laser sintering apparatus.

23. The electronic circuitry as recited in claim 19, wherein the polyimide has a thickness of at least 5 microns.

24. The electronic circuitry as recited in claim 19, wherein the polyimide has a thickness of at least 2.3 microns.

25. The electronic circuitry as recited in claim 19, wherein the substrate comprises silicon.

* * * * *